(12) United States Patent
Niemann et al.

(10) Patent No.: US 7,115,850 B2
(45) Date of Patent: Oct. 3, 2006

(54) SENSOR DEVICE WITH THREE-DIMENSIONAL SWITCH CARRIER HAVING DIFFERENTLY ORIENTED INFRARED PHOTODETECTORS

(75) Inventors: Thomas Niemann, Delmenhorst (DE); Thomas Henke, Stubben (DE); Carsten Heilenkötter, Weyhe (DE)

(73) Assignee: Hella KGaA Hueck & Co., Lippstadt (DE)

( * ) Notice: Subject to any disclaimer, the term of this patent is extended or adjusted under 35 U.S.C. 154(b) by 74 days.

(21) Appl. No.: 10/928,908

(22) Filed: Aug. 27, 2004

(65) Prior Publication Data

US 2005/0045802 A1 Mar. 3, 2005

(30) Foreign Application Priority Data

Aug. 29, 2003 (DE) ................ 103 40 346

(51) Int. Cl.
*G01C 21/02* (2006.01)
*G01J 1/42* (2006.01)
*G01J 5/02* (2006.01)
(52) U.S. Cl. ................ 250/203.4; 250/208.2; 250/399.05
(58) Field of Classification Search ................ 250/221, 250/203.4, 208.2, 339.05
See application file for complete search history.

(56) References Cited

U.S. PATENT DOCUMENTS

| | | | |
|---|---|---|---|
| 4,760,772 A | 8/1988 | Horiguchi et al. | |
| 5,072,105 A | 12/1991 | Osawa | |
| 5,181,654 A | 1/1993 | Yoshimi et al. | |
| 6,297,740 B1 | 10/2001 | Hill et al. | |
| 6,982,407 B1 * | 1/2006 | Hotta | 250/221 |
| 2003/0001074 A1 | 1/2003 | Chiasson et al. | |

FOREIGN PATENT DOCUMENTS

| | | |
|---|---|---|
| DE | 38 21 743 | 1/1990 |
| DE | 39 22 153 | 1/1991 |
| DE | 40 41 769 | 7/1992 |
| DE | 40 41 770 | 7/1992 |
| DE | 100 16 419 | 11/2001 |
| EP | 0 350 866 | 1/1990 |

OTHER PUBLICATIONS

Search Report of German Patent and Trademark Office with English translation.
European Search Report.
* cited by examiner

*Primary Examiner*—Georgia Epps
*Assistant Examiner*—Pascal M. Bui-Pho
(74) *Attorney, Agent, or Firm*—Collard & Roe, P.C.

(57) ABSTRACT

A sensor device is provided for generating an electrical output signal in dependence on the position of a light source in relation to the sensor device. The sensor device has a three-dimensional switch carrier with several adjacent faces oriented in different directions, on which faces at least two sensors are arranged. On the two sides of a central face, there is arranged in each case a face, with an infrared light (IR) photodetector in each case, oriented at an angle to the central face, whereby the faces on which the IR photodetectors are arranged are not directly adjacent to one another.

15 Claims, 6 Drawing Sheets

SENSOR DEVICE WITH THREE-DIMENSIONAL SWITCH CARRIER HAVING DIFFERENTLY ORIENTED INFRARED PHOTODETECTORS

CROSS REFERENCE TO RELATED APPLICATIONS

Applicants claim priority under 35 U.S.C. §119 of German Patent Application No. 103 40 346.9 filed Aug. 29, 2003.

BACKGROUND OF THE INVENTION

1. Field of the Invention

The present invention relates to a sensor device for generating an electrical output signal in dependence on the position of a light source in relation to the sensor device.

2. The Prior Art

A sensor device of the type mentioned at the outset is known from EP 0 350 866 B1. The known sensor device has a photodetector, to which a geometrically specially formed light modulator is assigned. A light diffuser for the diffuse propagation or the dispersion of the incident light is also arranged between the light modulator and the photodetector.

SUMMARY OF THE INVENTION

The problem underlying the invention is to provide a sensor device of the type mentioned at the outset, which is constructed in a particularly simple and space-saving manner.

The solution to this problem takes place with a sensor device in accordance with the invention as described below. Advantageous developments of the invention are also discussed below.

With a sensor device for generating an electrical output signal in dependence on the position of a light source in relation to the sensor device, whereby the sensor device has a three-dimensional switch carrier with several adjacent faces oriented in different directions, on which faces at least two sensors are arranged, it is essential to the invention that, on the two sides of a central face oriented in particular forwards, there is arranged in each case a face, with an infrared light (IR) photodetector in each case, oriented at an angle to the central face, whereby the faces on which the IR photodetectors are arranged are not directly adjacent to one another. A photodetector which is designed as a photodetector in the region of visible light is preferably arranged on the central face.

Such a sensor device is used in particular in motor vehicles in order to generate a signal in dependence on the radiation intensity and radiation direction and in order to be able to ascertain the incident light radiation, in particular the direction of the insolation, and then, in the dependence thereon, suitably to control certain systems, for example an air-conditioning system. As a result of the sensor device according to the invention, two or more sensors that reliably detect, in particular, the lateral irradiation can be arranged on a small space. Specially designed light guides are not absolutely essential with such a form of embodiment. In addition, such a sensor device can be produced particularly small. The sensors of the sensor device can for example be designed as temperature sensors or preferably as photodetectors. In particular, the control of an air-conditioning system in motor vehicles is possible with such sensors.

A photodetector for detecting visible light is arranged to advantage on the central face preferably oriented forwards in the travel direction of the motor vehicle. This face and therefore the photodetector arranged thereon are arranged tilted somewhat to the rear.

The sensor device preferably has three sensors, in particular three photodetectors, which are arranged in different orientations from one another. At least two photodetectors are preferably designed as IR photodetectors. Such IR photodetectors measure particularly well the thermal irradiation from the sun. These two photodetectors are preferably, oriented towards the sides of the motor vehicle, so that it can be established whether the insolation is coming more from the right-hand side of the vehicle or more from the left-hand side of the vehicle and an air-conditioning system can be controlled accordingly. In a preferred development of the invention, one of the photodetectors is designed as a photodetector in the region of visible light. Such a photodetector is used in particular for the simulation or detection of the light that the human eye also perceives and is therefore particularly suitable for generating signals that are decisive for switching-on or switching-off the interior instrument lighting and/or the driving lights or dipped beams. The photodetectors are preferably designed as photodiodes.

In a particularly preferred development of the invention, the photodetectors are fixed on a three-dimensional, injection-molded switch carrier. In particular, an MID technique (Molded Interconnect Devices) is used, whereby such an MID element consists of a three-dimensional conductor, in particular a thermoplastic with conductor strips arranged thereon, whereby the described photodetectors or photodiodes, in particular, are arranged on these conductor strips. The sensor device is preferably designed in such a way that the surface normals of the sensors, in particular of the IR photodetectors, intersect at an angle between 90° and 180°, in particular at an angle between 100° and 120°. In another, particularly preferred development, the surface normals of the IR photodetectors intersect at an angle between 60° and 80°, in particular at an angle of 70°. The surface normals of the IR photodetectors have intersecting angles with the base plane of the sensor device that diverge from 90° in both dimensions. The angle between the surface normals of the IR photodetectors and the base plane preferably lies between 35° and 55°, in particular at 45°. This means in particular that the IR photodetectors are not only arranged on faces inclined to the sides, but also that these faces are also tilted or tipped. In the travel direction relative to the car, the sensor device is used in such a way that the faces are tilted obliquely forwards. The IR detectors are preferably arranged symmetrical to the centrally arranged photodetector for visible light.

In a further development of the invention, a display for a theft warning system is integrated into the sensor device. This display is preferably aligned parallel to a base plane of the photodetector device. This display is thus oriented upwards and readily visible.

In another preferred development, the sensor device has a light-transmitting cover covering the photodetectors. The cover is preferably made from a light-transmitting plastic and can, according to the desired light characteristic, be colorless, whitish, greenish or greyish. In a particularly preferred development of the invention, the cover has additional optical elements. With such optical elements, the directional sensitivity already produced by the geometrical orientation of the IR photodetectors can be enhanced. The optical elements are preferably designed as light-conducting elements, in particular tubular ones, directed onto the sensors, especially the IR photodetectors. The light-conducting elements are preferably oriented at right angles to the photodetectors. In this way, a particularly reliable direction-dependent evaluation is possible. The light-conducting elements can preferably also be designed as lenses and/or as specially formed wall sections. The specially formed wall sections can be formed as a special light-conducting element by fluting, a special roughness or by another, in particular thinner, wall thickness.

BRIEF DESCRIPTION OF THE DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
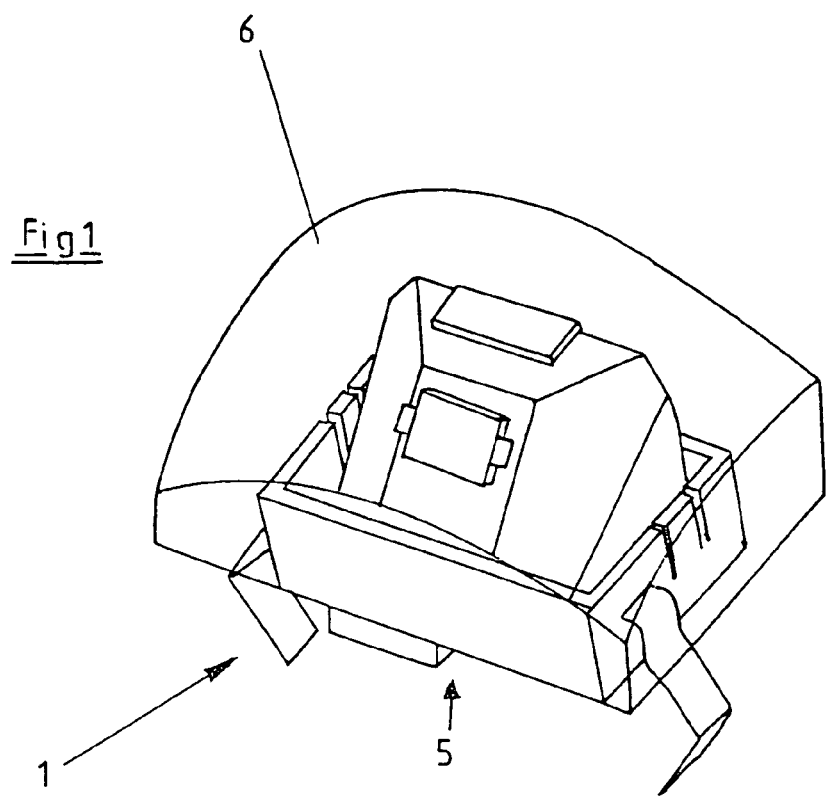
FIG. 1 is a perspective overall view of a sensor device according to the invention.
Figure 2:
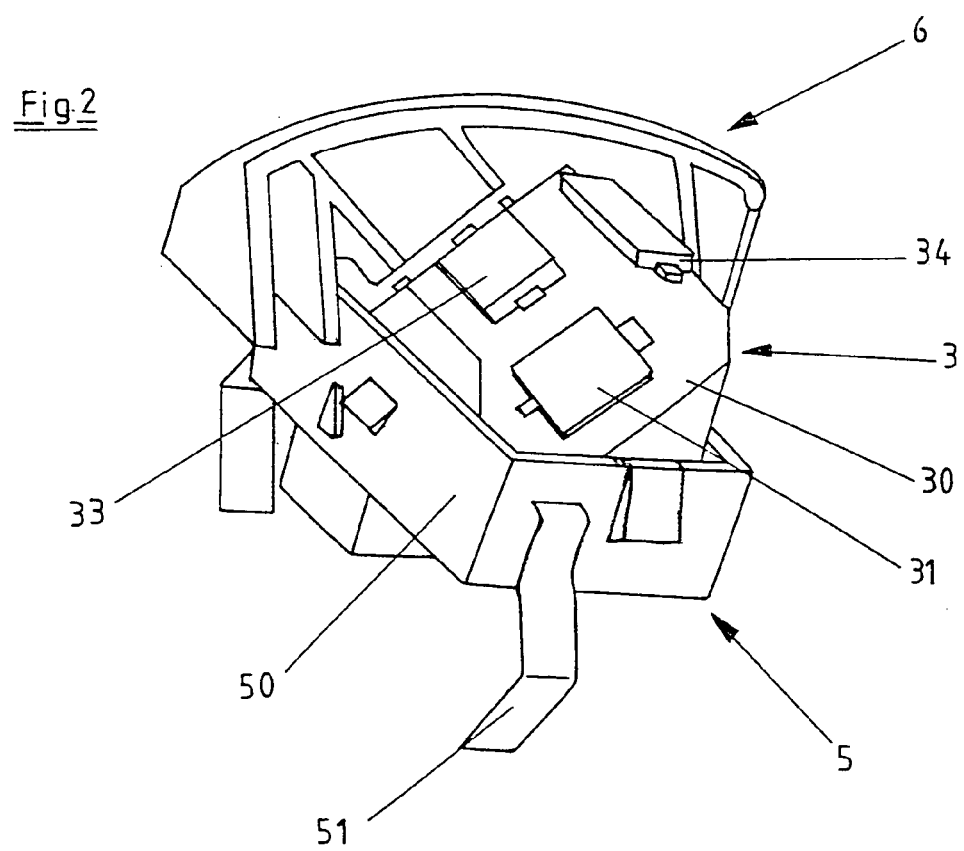
FIG. 2 is a second perspective view of a sensor device according to the invention, in which a part of the cover covering the sensor device is shown cut away.

Perspective views of sensor device 1 according to the invention are represented in FIGS. 1 and 2. The sensor device essentially comprises-three elements, i.e. a three-dimensional, injection-molded switch carrier 3, a lower housing 5 and a cover 6. Injection-molded switch carrier 3 is accommodated in a box-like basic body 50 of lower housing 5, which in turn has spring legs 51 with which the injection-molded switch carrier can be arranged, for example, on a dashboard of a motor vehicle. Lower housing 5 is also provided with snap-in elements, which co-operate with corresponding snap-in elements in cover 6. FIG. 1 shows a cover 6 which is formed from a homogeneous layer, which purely and simply has a protecting and light-scattering function, so that the light entering through cover 6 reliably falls onto photodetectors 31, 32 and 33 lying thereunder and, in addition, display 34 of the theft warning system can be seen from the exterior. The individual elements of sensor device 1 will be explained further in the following by reference to the individual representations in FIGS. 3 to 6.

Figure 3:
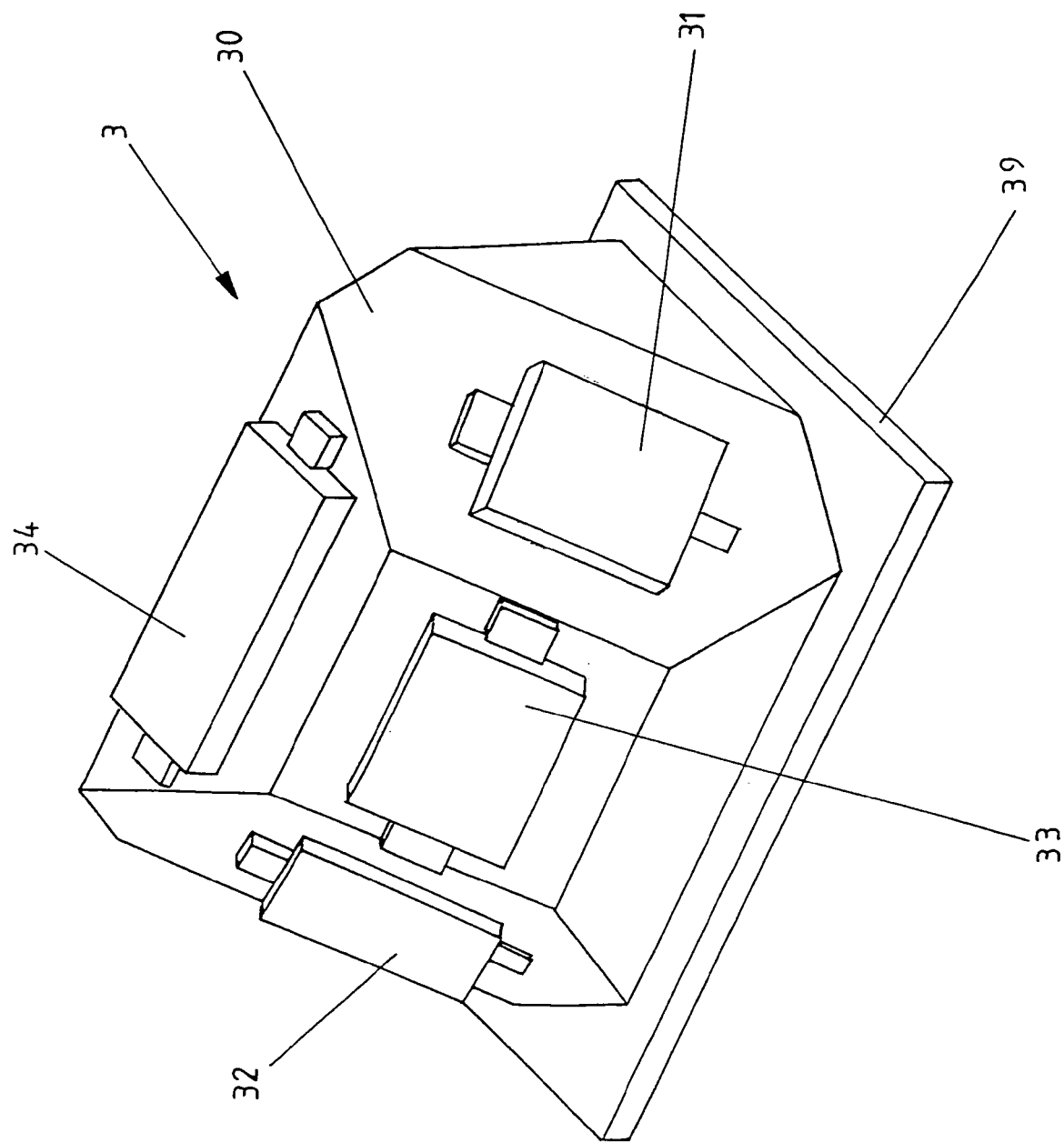
FIG. 3 is a perspective view of a three-dimensional switch carrier of the device according to the invention.

FIG. 3 shows a first perspective view, i.e. essentially a view from above, onto injection-molded switch carrier 3 with IR photodetectors 31 and 32 arranged thereon and photodetector 33 for visible light. The three photodetectors are designed as photodiodes, which are arranged on the injection-molded three-dimensional switch carrier. Each photodetector is arranged on a plane of injection-molded switch carrier 3.

Injection-molded switch carrier 3 has in total four faces occupied by functional units, all of said faces being oriented at different angles to one another. An upper plane, for accommodating display 34 of the theft warning system, is provided parallel to base plane 39 of injection-molded switch carrier 3 and also sensor device 1. Display 34 for the theft warning system is oriented precisely upwards. This plane is designed trapezoidal, and joining onto the oblique sides are two planes sloping forwards, on which IR photodiodes 31 and 32 are arranged. IR photodiodes 31 and 32 are facing the outsides, viewed in the travel direction of the car, and are oriented forwards, running inwards and at the same time tilted upwards. On the short parallel side of the trapezium, on which display 34 of the theft warning system is arranged, there is arranged an essentially square face oriented essentially forwards and slightly upwards, with photodetector 33 for visible light. This photodetector 33 is used for the control of the instrument lighting. Joining onto the two sides of the face with photodetector 33 there are in turn the faces with IR photodetectors 31 and 32 running at an angle with respect to this face.

Figure 4:
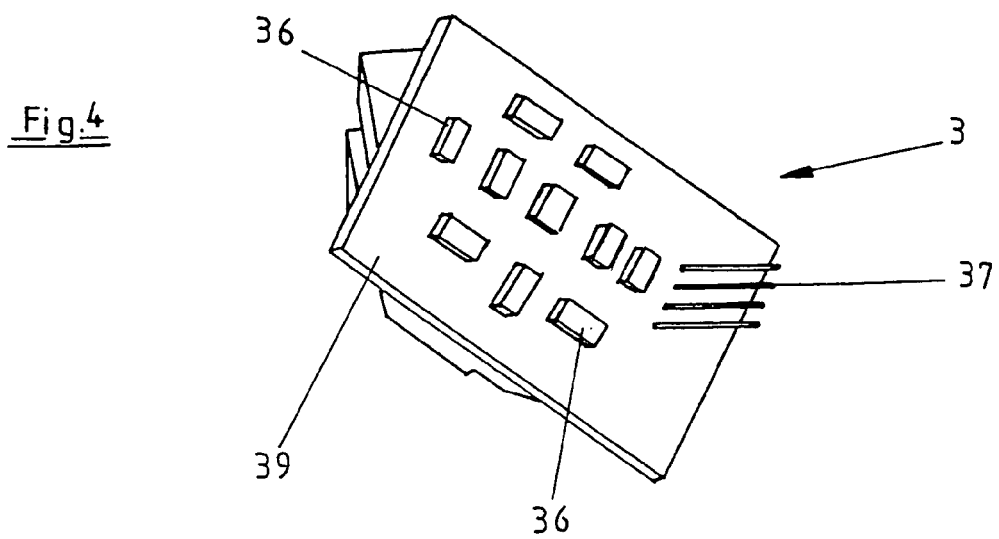
FIG. 4 is a bottom view of the injection-molded switch carrier according FIG. 3.

FIG. 4 shows a bottom view of injection-molded switch carrier 3, whereby base plane 39 with electrical and/or electronic components 36 arranged thereon is shown in particular. Faces 30 of injection-molded switch carrier 3 are essentially produced from a thermoplastic material, whereby the electrical connections for the photodetectors and electronic components 36 are provided thereon. Four connection pins 37 for activating the photodetectors and display 34 are also provided.

Figure 5:
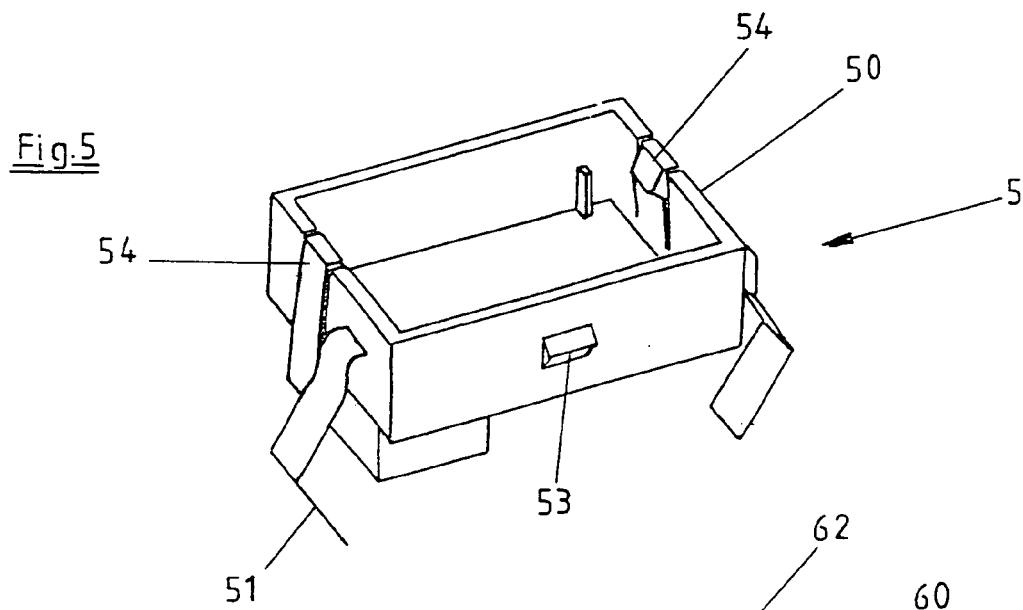
FIG. 5 is a perspective view of a lower housing of the sensor device.

FIG. 5 shows lower housing 5, which essentially has a box-shaped basic body 50, on which springs 51 pointing downwards are arranged, with which the sensor device is fixed at the assembly point. Injection-molded switch carrier 3 with its base plane 39 can be inserted in a keyed manner into box-shaped basic body 50. Snap-in elements 53 are also provided in the outer area and snap-in elements 54 on the top side.

Figure 6:
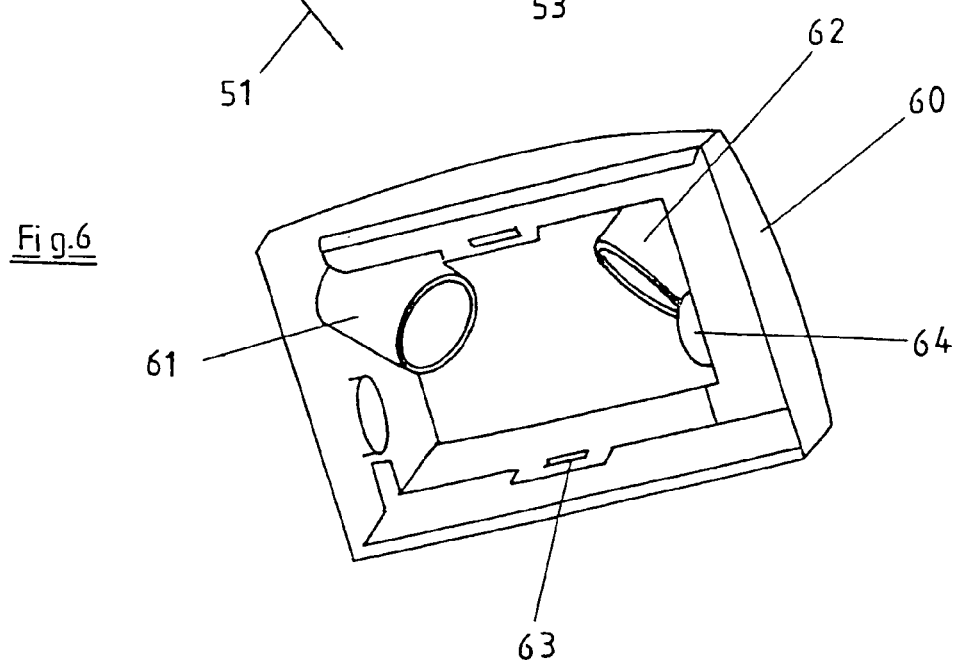
FIG. 6 is a perspective view of the cover of the sensor device according to the invention from below.

FIG. 6 shows a bottom view of cover 6, which is essentially made from a transparent or semi-transparent plastic material 60. Integrated into this cover 6, which as a rule is also injection-molded, are snap-in elements 63 and 64, which correspond to snap-in elements 53 and 54 of lower housing 5. As additional to the representation of cover 6 in FIGS. 1 and 2, there are provided here light-conducting elements 61, 62, which are designed tubular and enable an amplified, direction-dependent incident light radiation onto IR-photodetectors 31 and 32 arranged below them.

Figure 7:
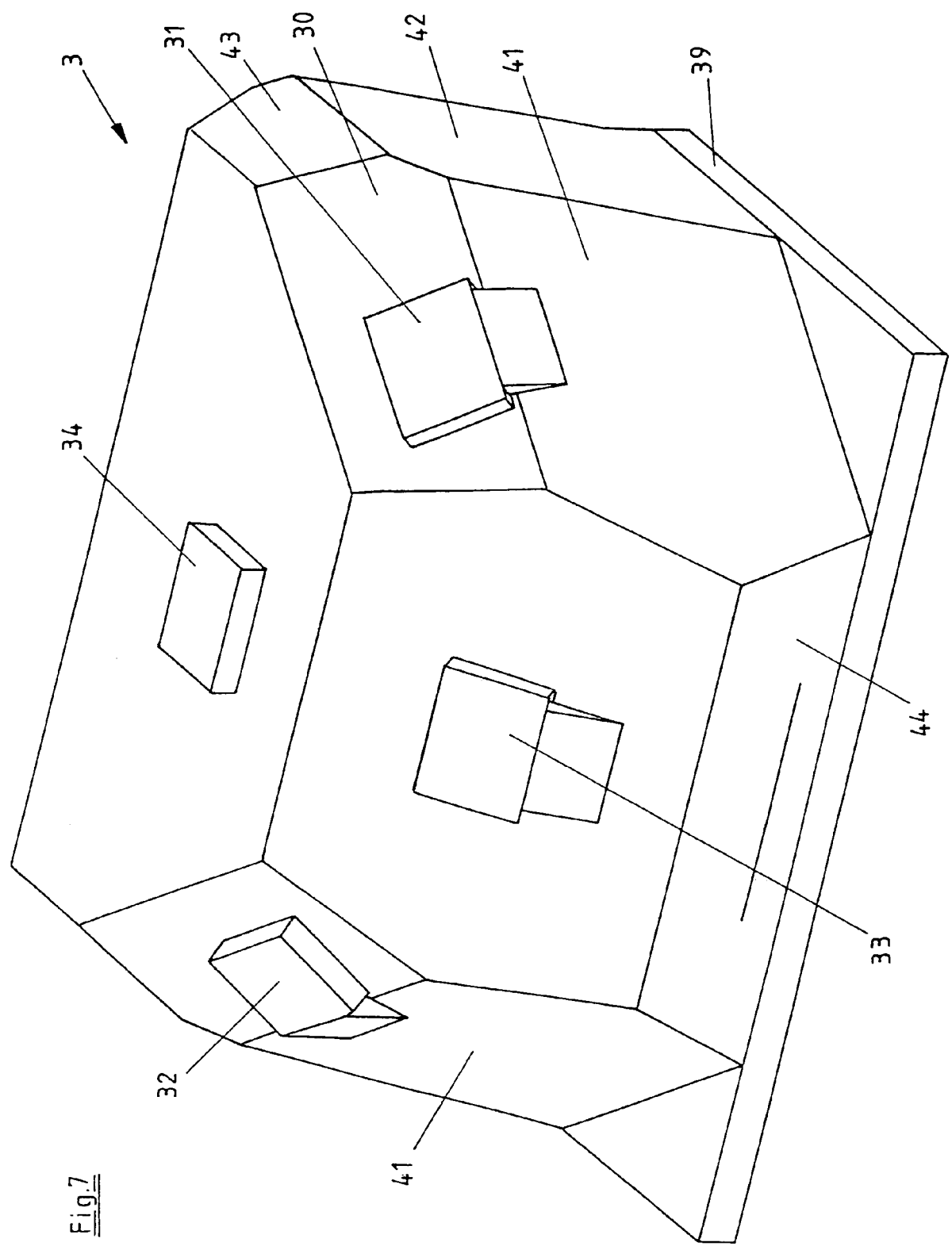
FIG. 7 is a perspective view of a second form of embodiment of a three-dimensional switch carrier of the device according to the invention.

FIG. 7 shows a perspective view of a second form of embodiment of a switch carrier according to the invention, comparable to FIG. 3. Switch carrier 3 also has IR-photodetectors 31 and 32 and photodetector 33 for visible light. The switch carrier is used in a motor vehicle in such a way that photodetector 33 is oriented forwards. Base plate 39 is mounted horizontally, so that photodetector 33 is tilted with its plane sloping backwards over lower face 44, so that photodetector 33 is tilted slightly upwards. Faces 30 with IR-photodetectors 31 and 32 mounted thereon follow on at the right-hand and left-hand side of photodetector 33. In relation to the face of photodetector 33, the IR photodetectors 31 and 32 are tilted sloping backwards and upwards. A particularly good direction-dependent detection of the insolation thus becomes possible. A particularly precise directional characteristic results. Flexible possibilities for the design of the directional characteristic also result from the overall design of three-dimensional switch carrier 3. A number of photodiodes can also be accommodated on the basic body, so that the variability of the possibilities is increased still further. This form of embodiment of the switch carrier can also be used in combination with a certain filter characteristic of the cover and optionally of the photodetector, as a result of which a wave-dependent detection and evaluation of the sunlight becomes possible.

Underneath face 30 with a IR-photodetector 31 is a face 41, which is tilted with respect to face 30. Face 41 extends to base plane 39 and ends on base plane 39, whereby a free corner of base plane 39 remains. Face 41 abuts the front central face, on which the photodetector 33 is provided, and has a common line with face 44. Face 42 is disposed adjacent face 41, opposite to the side of face 41 having the common lines with a central face and face 44. Face 42 is tilted with respect to face 41 and extends mainly perpendicular from the base plane 39 upwards. Face 42 abuts face 30 in a corner area. At the top of face 42 is arranged a tilted face 43, which abuts tilted face 30 and on the tilted horizontal upper face, on which a display 34 is positioned.

Figure 8:
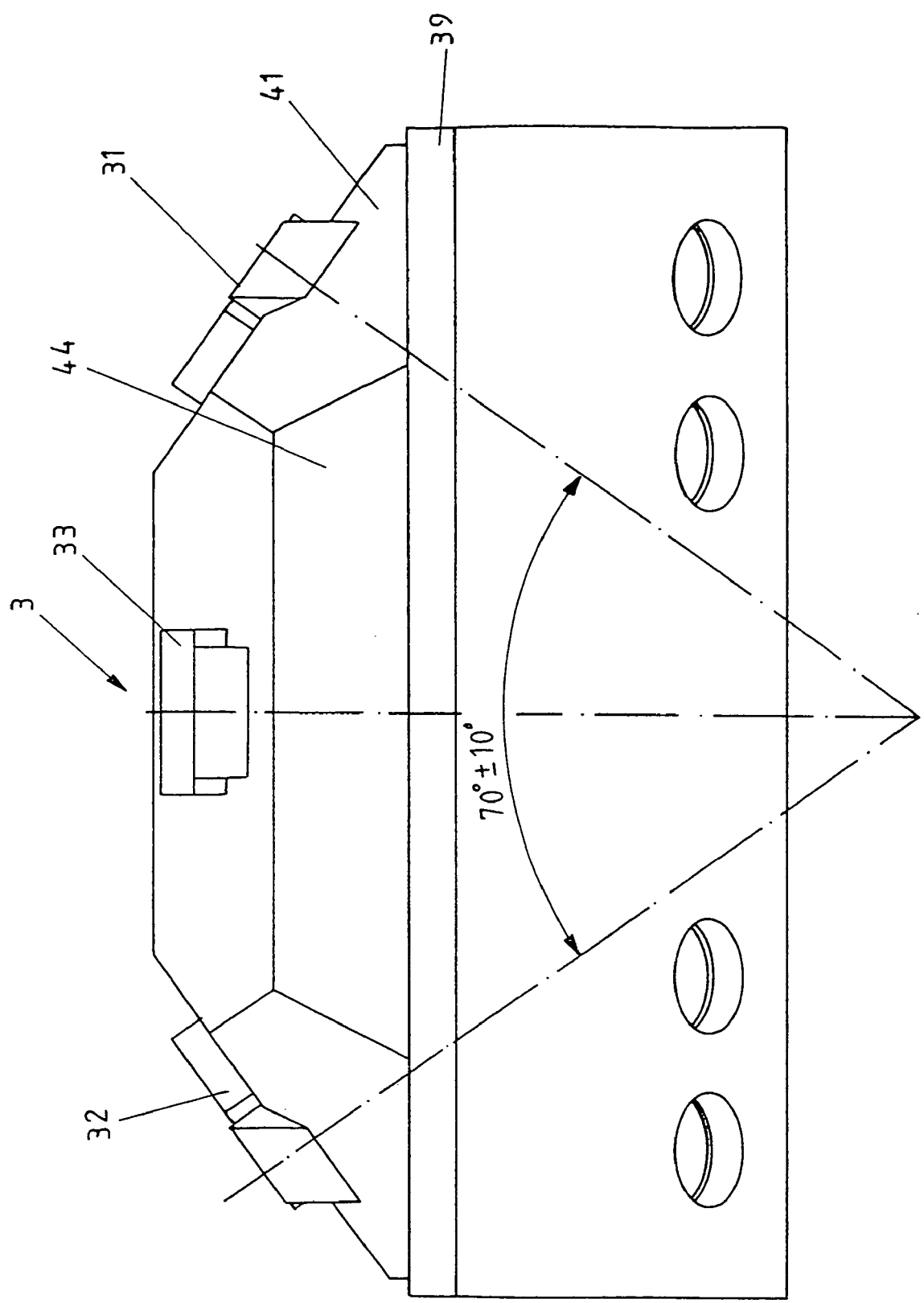
FIG. 8 is another perspective view of the second switch carrier according to the invention, according to FIG. 7.

FIG. 8 is a further perspective view of switch carrier 3, whereby switch carrier 3 is shown essentially from below, i.e. from the side of base plane 39. Surface normals through the faces of IR photodetectors 31 and 32 are represented as lines. These lines intersect at an angle of 70°. The photodetectors are oriented to one another at an angle of 70° ±10°, since a particularly good examination of the irradiation characteristic of the sun is thus achieved even with a relatively low solar attitude.

Figure 9:
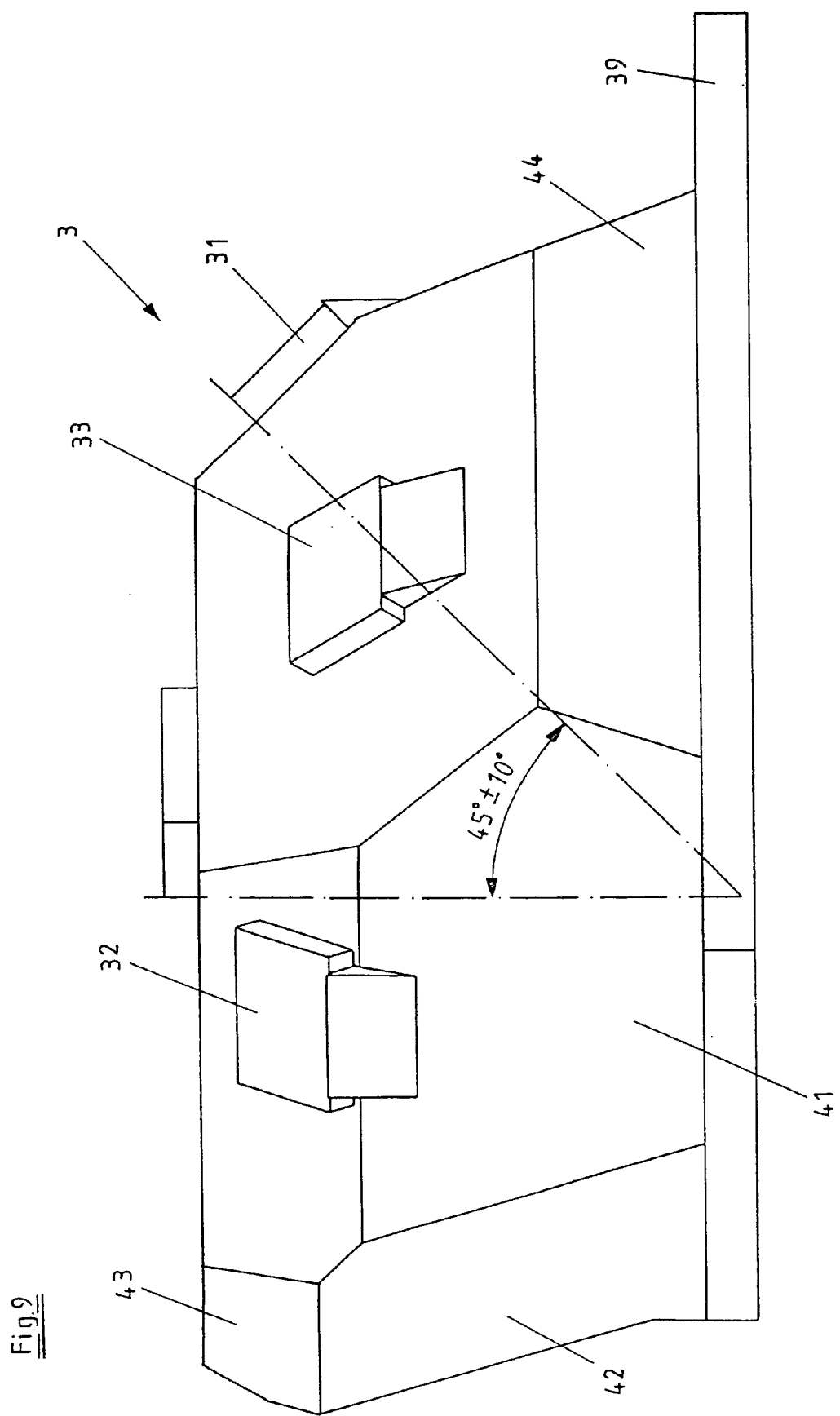
FIG. 9 is a third perspective view of the second switch carrier according to the invention, according to FIG. 7.

FIG. 9 shows the three-dimensional switch carrier in a view such that the face of IR photodetector 31 stands perpendicular in the plane of the drawing, so that the surface normal to IR photodetector 31 is shown by the dashed line. The surface normal of IR photodetector 31 is at an angle of 45° to the vertical or perpendicular of overall switch carrier 3. In alternative embodiments, this angle amounts to ±10°. On account of the mirror-symmetrical structure of switch carrier 3, the face of IR photodetector 32 is similarly at an angle of 45° to the vertical or also to base plane 39.

Although only a few embodiments of the present invention have been shown and described, it is to be understood that many changes and modifications may be made thereunto without departing from the spirit and scope of the invention as defined in the appended claims.

What is claimed is:

1. A sensor device for generating an electrical output signal in dependence on position of a light source in relation to the sensor device comprising a three-dimensional switch carrier having a plurality of adjacent faces oriented in different directions and at least two sensors arranged on said faces;

wherein said plurality of faces comprises a first face, a second face, and a central face between said first and second faces so that said first and second faces are not directly adjacent to one another;

wherein said at least two sensors comprises a first infrared light photodetector arranged on said first face and a second infrared light photodetector arranged on said second face, said first and second infrared photodetectors being oriented at an angle to said central face; and wherein a visible light photodetector is arranged on said central face.

2. The sensor device according to claim 1 it wherein said photodetectors are oriented in different directions from one another.

3. The sensor device according to claim 1, wherein the photodetectors comprise photodiodes.

4. The sensor device according to claim 1, wherein surface normals of said infrared light photodetectors intersect at an angle between 60° and 80°.

5. The sensor device according to claim 4, wherein said angle is 70°.

6. The sensor device according to claim 1, wherein surface normals of said infrared light photodetectors and a base plane of the sensor device have angles of intersection diverging from 90° in both dimensions.

7. The sensor device according to claim 1, wherein surface normals of said infrared light photodetectors and a base plane of the sensor device intersect at an angle between 35° and 55°.

8. The sensor device according to claim 7, wherein said angle is 45°.

9. The sensor device according to claim 1, wherein the infrared light photodetectors are arranged symmetrically to said visible light photodetector.

10. The sensor device according to claim 1, further comprising a display for a theft warning system integrated into the sensor device.

11. The sensor device according to claim 10, wherein said display is aligned parallel to a base plane of the sensor device.

12. The sensor device according to claim 1, further comprising a light-transmitting cover covering the sensors.

13. The sensor device according to claim 12, wherein said cover has optical elements.

14. The sensor device according to claim 13, wherein said optical elements comprise light-conducting elements directed onto said infrared light photodetectors.

15. The sensor device according to claim 14, wherein said light-conducting elements are oriented at right angles to the photodetectors.

* * * * *